United States Patent
Kim

(10) Patent No.: US 11,830,870 B2
(45) Date of Patent: Nov. 28, 2023

(54) ESD PROTECTION DEVICE AND MANUFACTURING METHOD THEREOF

(71) Applicant: DB HiTek Co., Ltd., Bucheon-si (KR)

(72) Inventor: Jong-Min Kim, Seoul (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 207 days.

(21) Appl. No.: 17/185,722

(22) Filed: Feb. 25, 2021

(65) Prior Publication Data
US 2021/0280574 A1    Sep. 9, 2021

(30) Foreign Application Priority Data

Mar. 4, 2020   (KR) .................. 10-2020-0026952

(51) Int. Cl.
  *H01L 27/02*   (2006.01)
(52) U.S. Cl.
  CPC ...... *H01L 27/0266* (2013.01); *H01L 27/0288* (2013.01)
(58) Field of Classification Search
  CPC .................................................. H01L 27/0266
  See application file for complete search history.

(56) References Cited

U.S. PATENT DOCUMENTS

| | | | |
|---|---|---|---|
| 10,276,557 B2 | 4/2019 | Han et al. | |
| 2002/0153569 A1* | 10/2002 | Katayama | H01L 29/78654 438/30 |
| 2004/0217424 A1* | 11/2004 | Shih | H01L 29/41733 257/E29.117 |
| 2018/0082994 A1 | 3/2018 | Han et al. | |

FOREIGN PATENT DOCUMENTS

KR  10-2018-0031175 A    3/2018

* cited by examiner

*Primary Examiner* — Matthew C Landau
*Assistant Examiner* — Mark Hatzilambrou
(74) *Attorney, Agent, or Firm* — Andrew D. Fortney; Central California IP Group, P.C.

(57) ABSTRACT

An ESD protection device (100) is disclosed. More particularly, the ESD protection device is configured so that a gate electrode (140) and a capacitor electrode (170) electrically connected to a drain region (162) are spaced apart from each other by a preset distance, and partially or entirely overlap each other, thereby increasing a capacitance (Cgd) between the gate electrode and the drain region.

12 Claims, 6 Drawing Sheets

ESD PROTECTION DEVICE AND MANUFACTURING METHOD THEREOF

CROSS REFERENCE TO RELATED APPLICATION

The present application claims priority to Korean Patent Application No. 10-2020-0026952, filed Mar. 4, 2020, the entire contents of which is incorporated herein for all purposes by this reference.

BACKGROUND OF THE INVENTION

Field of the Invention

The present disclosure relates to an ESD protection device or circuit 100 and, more particularly, to a device configured so that a gate electrode and a capacitor electrode electrically connected to a drain region are spaced apart from each other by a preset distance, and partially or entirely overlap each other, thereby increasing a capacitance Cgd between the gate electrode and the drain region.

Description of the Related Art

In general, in order to prevent an internal circuit from being damaged due to electrostatic current flowing into the semiconductor device from a human body or machine that has been electrostatically charged, an electrostatic discharge (ESD) protection circuit is designed and/or located between an internal circuit and a pad such as an input/output pad and a power/ground pad in a semiconductor device. As the degree of integration increases (e.g., as the number of components in a system-on-chip increases), the area occupied by the ESD protection device or circuit accounts for a relatively large proportion of the overall size of a semiconductor chip. In addition, since the ESD protection circuit is an important factor in determining the performance of the semiconductor chip, the importance of the ESD protection device or circuit is increasing.

FIG. 1 is a schematic circuit diagram of a conventional ESD protection device, and FIG. 2 is a graph showing current and voltage characteristics of a conventional ESD protection circuit.

Referring first to FIG. 2, in general, when a MOS device is used as an ESD protection device, a measure is taken to lower a triggering voltage Vt1 in order to secure operation stability. Referring to a first line 11 in FIG. 2, Vt1 is the triggering voltage for initiating an operation of a bipolar transistor that exists parasitically in the MOS device (e.g., the MOS transistor in FIG. 1), and Vt2 is a Fail threshold voltage at which the junction of the MOS device is destroyed due to a local increase in the temperature of the silicon caused by the power surging through the MOS device during ESD current discharge. In order to improve the ESD characteristics of the ESD protection device, Vt1 should be less than Vt2, and when this is the case, snapback occurs evenly in the MOS device. After triggering, the voltage on the pad (e.g., $N_1$ in FIG. 1) rapidly decreases, so this phenomenon is called "snapback." That is, a large amount of current may be discharged at a low voltage, so the snapback is advantageous in terms of power management.

Referring to FIG. 1, a method of lowering the triggering voltage Vt1 involves placing a resistor R between the gate electrode and the source of the MOS transistor, and connecting an external or stand-alone capacitor C between the gate electrode and a drain region. In this case, under normal operation, the $V_{DD}$ voltage maintains a steady state so that the voltage on the node $N_1$ is 0 V, and thus the ESD protection device maintains an OFF state. Thereafter, when an ESD event occurs that affects the power supply (e.g., $V_{DD}$), the voltage on the node $N_1$ increases due to the time constant response characteristics of the resistor R and the capacitor C, thereby turning the MOS device on and generating a bulk current from the current flowing through the channel of the MOS device. The bulk current causes the MOS device to behave as a bipolar junction transistor (BJT), which exists parasitically in the MOS device. Thus, when an ESD event occurs, the parasitic BJT turns on and operates in a snapback regime. Here, the higher the time constant of the RC circuit, the lower the value of the triggering voltage Vt1.

However, when an external or stand-alone capacitor is used in the ESD protection device of FIG. 1, inevitably the degree of integration of the ESD protection device decreases due to the area of the corresponding capacitor.

RELATED ART DOCUMENT (Patent Document 1) Korean Patent Application Publication No. 10-2018-0031175, "DEVICE FOR PROTECTING ESD"

SUMMARY OF THE INVENTION

Exemplary embodiments of the present disclosure are devised to solve the problem(s) of the related art, and an objective of the present disclosure is to provide an ESD protection device and circuit and a manufacturing method thereof, including a capacitor electrode connected to a metal interconnect, spaced apart from a gate electrode (e.g., of the ESD protection device/circuit), and overlapping an upper or uppermost surface of the gate electrode, so as to increase the gate-drain capacitance and lower a triggering voltage (e.g., of the ESD protection device/circuit).

In addition, another objective of the present disclosure is to provide an ESD protection device and circuit and a manufacturing method thereof, including a capacitor electrode configured to increase a gate-drain capacitance (e.g., of the ESD protection device/circuit), so that an external or stand-alone capacitor for the ESD protection device/circuit is not needed, thereby increasing the degree of integration due to a decrease in the total area of the ESD protection device/circuit.

In addition, yet another objective of the present disclosure is to provide an ESD protection device and circuit and a manufacturing method thereof, wherein a capacitive plate or layer of the capacitor electrode is not formed on a drain region, thereby preventing an increase in the drain operating voltage.

The present disclosure may be implemented by one or more exemplary embodiments having one or more of the following configurations in order to achieve the above-described objectives.

According to at least one exemplary embodiment of the present disclosure, an ESD protection device or circuit according to the present disclosure includes: a substrate; a semiconductor layer on the substrate; a gate insulating film on the semiconductor layer; a gate electrode on the gate insulating film; a source region in the semiconductor layer, adjacent to or partially overlapping a first side of the gate electrode; a drain region in the semiconductor layer, adjacent to or partially overlapping a second side of the gate electrode; a lower insulating layer and an upper insulating layer on or over the semiconductor layer; a first metal contact extending through the lower insulating layer to the source region; a second metal contact extending through the lower insulating layer to the drain region; a metal interconnect on the lower insulating layer, electrically connected to the second metal contact; and a capacitor electrode electrically connected to the metal interconnect and overlapping the gate electrode.

According to exemplary embodiment(s) of the present disclosure, the ESD protection device/circuit according to the present disclosure may further include: a capacitor contact connected to the metal interconnect and extending through the lower insulating layer; and a capacitive plate or layer connected to the capacitor contact, extending from over the first side of the gate electrode (e.g., adjacent to the drain region) and across the gate electrode, partially or entirely overlapping the upper or uppermost surface of the gate electrode.

According to exemplary embodiment(s) of the present disclosure, in the ESD protection device/circuit according to the present disclosure, the capacitive plate or layer may be spaced apart upward from the upper or uppermost surface of the gate electrode by a preset distance.

According to exemplary embodiment(s) of the present disclosure, in the ESD protection device/circuit according to the present disclosure, the capacitive plate or layer may have one or more regions overlapping the gate electrode that are substantially parallel to the upper or uppermost surface of the gate electrode.

According to exemplary embodiment(s) of the present disclosure, the metal interconnect may have an end that overlaps the gate electrode, and the capacitor electrode may include a capacitor contact connected to the end of the metal interconnect; and a capacitive plate or layer connected to the capacitor contact, extending over or crossing an upper or uppermost surface of the gate electrode, being spaced apart from the upper or uppermost surface of the gate electrode, and/or partially or entirely overlapping the gate electrode, but not completely overlapping the drain region.

According to one or more other exemplary embodiments of the present disclosure, an ESD protection device or circuit according to the present disclosure includes: a substrate; a semiconductor layer on the substrate; a gate insulating film on the semiconductor layer; a gate electrode on the gate insulating film; a source region in the semiconductor layer, adjacent to or partially overlapping a first side of the gate electrode; a drain region in the semiconductor layer, adjacent to or partially overlapping a second side of the gate electrode; a lower insulating layer on the semiconductor layer; a metal contact extending through the lower insulating layer to the drain region; a metal interconnect on the lower insulating layer, connected to the metal contact; and a capacitor electrode electrically connected to the metal interconnect and overlapping the gate electrode, wherein the capacitor electrode may include: a capacitor contact connected to the metal interconnect; and a capacitive plate or layer connected to the capacitor contact, extending laterally and overlapping an upper or uppermost surface of the gate electrode, spaced apart from the upper or uppermost surface of the gate electrode.

According to exemplary embodiment(s) of the present disclosure, in the ESD protection device/circuit according to the present disclosure, the capacitor contact may overlap the drain region, and the capacitive plate or layer may extend from over the drain region toward the source region and overlap the upper or uppermost surface of the gate electrode.

According to exemplary embodiment(s) of the present disclosure, in the ESD protection device/circuit according to the present disclosure, a separation distance between the gate electrode and the capacitive plate or layer may be less than a breakdown voltage (e.g., of the ESD protection device) divided by a threshold field (e.g., of, applied to, or generated by the ESD protection device).

According to exemplary embodiment(s) of the present disclosure, in the ESD protection device/circuit according to the present disclosure, the metal interconnect may have an end that overlaps the gate electrode, the capacitor contact may be connected to the metal interconnect, and the capacitive plate or layer may be connected to the lowermost surface of the capacitor contact and extend substantially parallel to the upper or uppermost surface of the gate electrode.

According to one or more further exemplary embodiments of the present disclosure, an ESD protection device/circuit according to the present disclosure includes: a substrate; a semiconductor layer on the substrate; a gate insulating film on the semiconductor layer; a gate electrode on the gate insulating film; a source region in the semiconductor layer; a drain region in the semiconductor layer and spaced apart from the source region; a lower insulating layer on the semiconductor layer; a metal contact passing through the lower insulating layer and extending to the drain region; a metal interconnect on the lower insulating layer, connected to the metal contact; a field plate partially overlapping the gate electrode on one side adjacent to the drain region; an insulating part or layer electrically separating the gate electrode from the field plate; and a capacitor electrode electrically connected to the metal interconnect, partially overlapping the gate electrode, and spaced apart from the field plate.

According to exemplary embodiment(s) of the present disclosure, in the ESD protection device/circuit according to the present disclosure, the insulating part or layer may be have a stepped structure, from a surface of the drain region, on a side surface of the gate electrode, and on an upper or uppermost surface of the gate electrode, and the field plate may be on an upper or uppermost surface of the insulating part or layer and have a shape substantially complementary or conforming to the insulating part or layer.

According to exemplary embodiment(s) of the present disclosure, in the ESD protection device/circuit according to the present disclosure, the capacitor electrode may include: a capacitor contact extending from the metal interconnect; and a capacitive plate or layer connected to the capacitor contact and over an edge or sidewall of the gate electrode adjacent to the source region.

According to exemplary embodiment(s) of the present disclosure, in the ESD protection device/circuit according to the present disclosure, the capacitive plate or layer may comprise the same material as the field plate.

According to exemplary embodiment(s) of the present disclosure, in the ESD protection device/circuit according to the present disclosure, the capacitive plate or layer may extend substantially parallel to the gate electrode and may be spaced apart from the field plate.

According to one or more exemplary embodiment(s) of the present disclosure, a method of manufacturing an ESD protection device according to the present disclosure includes: depositing a gate insulating film on a substrate; forming a gate electrode on the gate insulating film; forming a source region and a drain region in a semiconductor layer of the substrate; forming a salicide block layer on the gate electrode; forming a capacitive plate or layer over the gate electrode by depositing and then etching a conductive film on the salicide block layer; forming a lower insulating layer on the capacitive plate or layer and the salicide block layer;

forming contact holes in the lower insulating layer, one of which exposes an upper or uppermost surface of the capacitive plate or layer; forming contacts in the contact holes; and forming a metal interconnect on the lower insulating layer, connected to the one of the contacts.

According to exemplary embodiments of the present disclosure, in the method of manufacturing the ESD protection device according to the present disclosure, the one contact may extend from the metal interconnect to the drain region or a position over the drain region, and the capacitive plate or layer may extend from the one contact to a location over or past a sidewall of the gate electrode adjacent to the source region.

According to exemplary embodiments of the present disclosure, in the method of manufacturing the ESD protection device according to the present disclosure, the one contact may extend from the metal interconnect to a position above the upper or uppermost surface of the gate electrode, and the capacitive plate or layer may overlap the upper or uppermost surface of the gate electrode from the one contact to a position over the sidewall of the gate electrode adjacent to the source region.

According to exemplary embodiments of the present disclosure, the method of manufacturing the ESD protection device according to the present disclosure further includes: forming an upper insulating layer on the lower insulating layer after depositing a sacrificial layer on the lower insulating layer, patterning and etching the sacrificial layer to form a plurality of trenches, filling the trenches with a metal to form the metal interconnect, and removing the sacrificial layer.

The exemplary embodiments of the present disclosure have the following effects by the described configurations.

In exemplary embodiments of the present disclosure, the capacitor electrode connected to the metal interconnect is spaced apart from the gate electrode and overlaps the upper or uppermost surface of the gate electrode to increase the gate-drain capacitance value (e.g., of the MOS transistor in the ESD protection circuit), thereby lowering the triggering voltage value (e.g., of the ESD protection circuit).

In addition, in exemplary embodiments of the present disclosure, there may be a derived effect in which the capacitor electrode increases the gate-drain capacitance value, so that an external or stand-alone capacitor for the ESD protection circuit is not necessary, whereby the degree of integration is increased by decreasing the total area of the device.

In addition, in the exemplary embodiments of the present disclosure, there exist an effect in that the capacitive plate or layer of the capacitor electrode is not allowed to be formed on the drain region, thereby preventing the increase of the drain operating voltage.

Meanwhile, even though certain effects may not be explicitly mentioned herein, the effects described in the following specification and potential effects that are expected by the technical features of the present disclosure, are treated as being described in the present disclosure.

DETAILED DESCRIPTION OF THE INVENTION

The exemplary embodiments of the present disclosure may be modified in various forms, and the scope of the present disclosure should not be construed as being limited to the following exemplary embodiments, but may be interpreted on the basis of the claims. In addition, the present exemplary embodiments are provided for reference in order to more completely describe the present disclosure to those skilled in the art.

In the following specification, a first component arranged or positioned "on", or on "a top of", "an upper side of", or "an upper part of" a second component includes both the first component being positioned in contact with a surface of the second component, as well as the first component being at a certain distance apart from the second component. In addition, when the first component is spaced apart from the second component, another component may be between the two components. In addition, when the first component is arranged "directly on the second component" or "directly above the second component", another component may not be between the two components.

In addition, terms such as "first" and "second" may be used to describe various items such as various components, regions and/or parts, but the above items are not limited by these terms, and it should be noted that the second element is not the first element.

Figure 1:
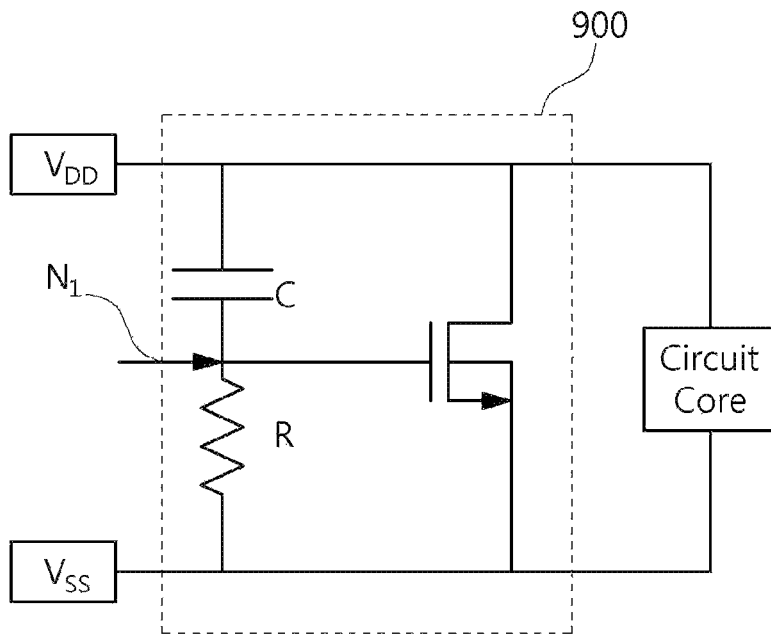
FIG. 1 is a schematic circuit diagram of an ESD protection circuit, according to a conventional ESD protection device and exemplary embodiments of the present disclosure.
Figure 2:
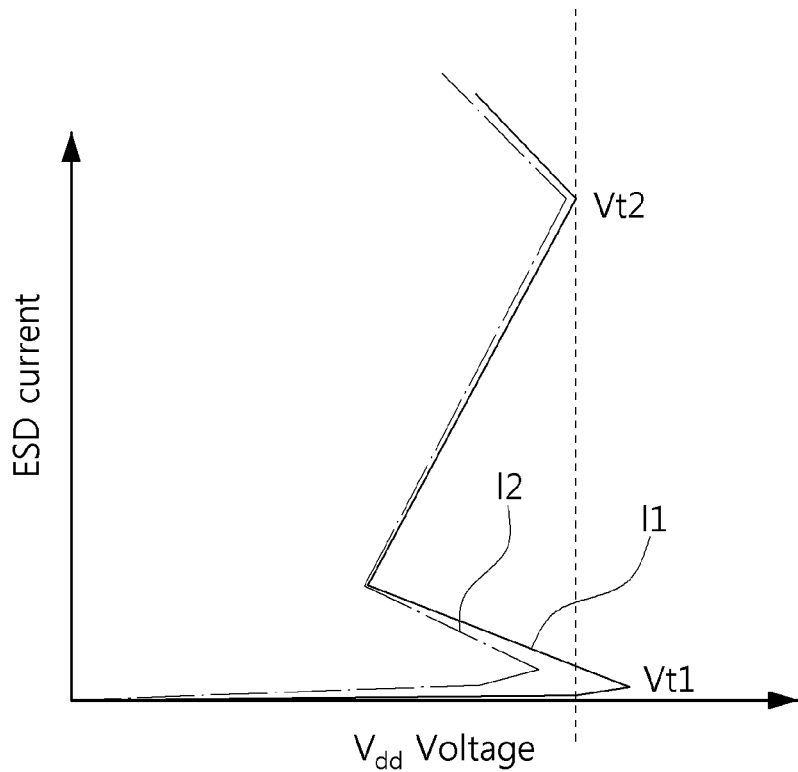
FIG. 2 is a graph showing current and voltage characteristics of the conventional ESD protection device/circuit.

FIG. 2 is a graph showing current and voltage characteristics of an ESD protection circuit, according to a conventional ESD protection device and exemplary embodiments of the present disclosure.

Referring to a first line 11 of FIG. 2, Vt1 is a triggering voltage for initiating an operation of a bipolar transistor that exists parasitically in the MOS device, and Vt2 is a failure threshold voltage at which the junction of the MOS device is destroyed due to a local increase in the temperature of the silicon affected by a power surge through the MOS device during ESD current discharge. In order to improve the ESD characteristics of the ESD protection device/circuit, Vt1 should be less than Vt2. When this is the case, snapback occurs evenly inside the MOS device. After triggering, the voltage on the pad (e.g., at which the ESD event occurred) rapidly decreases, so this phenomenon is called snapback. That is, a large amount of current may be discharged at a low voltage, so the snapback is advantageous in terms of power management. The second line 12 in FIG. 2 shows the current and voltage characteristics of the ESD protection device/circuit according to exemplary embodiments of the present disclosure. As shown, the value of the triggering voltage is lower than that of the first line 11. The characteristics will be described in detail below.

Figure 3:
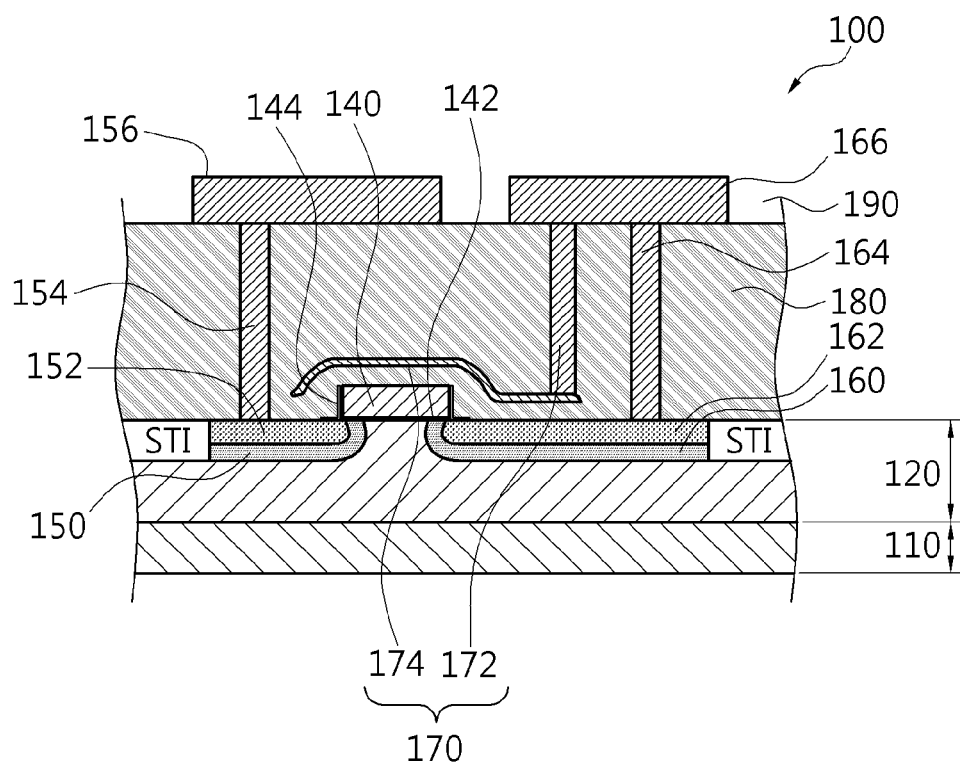
FIG. 3 is a cross-sectional view of the ESD protection device according to one or more embodiments of the present disclosure.
Figure 4:
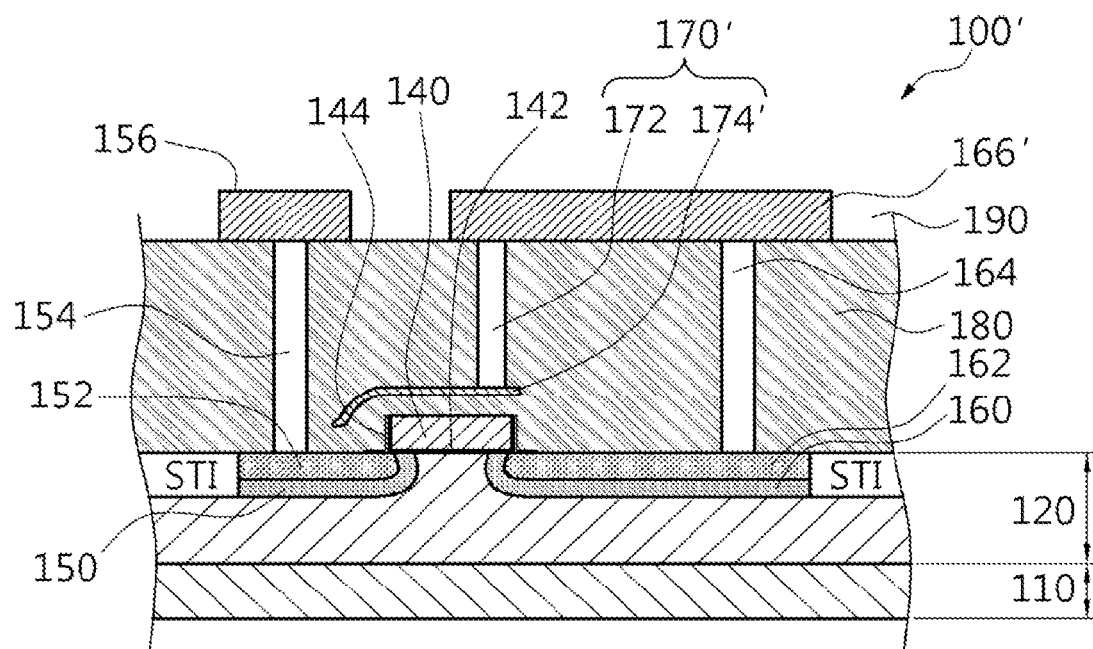
FIG. 4 is a cross-sectional view of an ESD protection device according to one or more other exemplary embodiment of the present disclosure.
Figure 5:
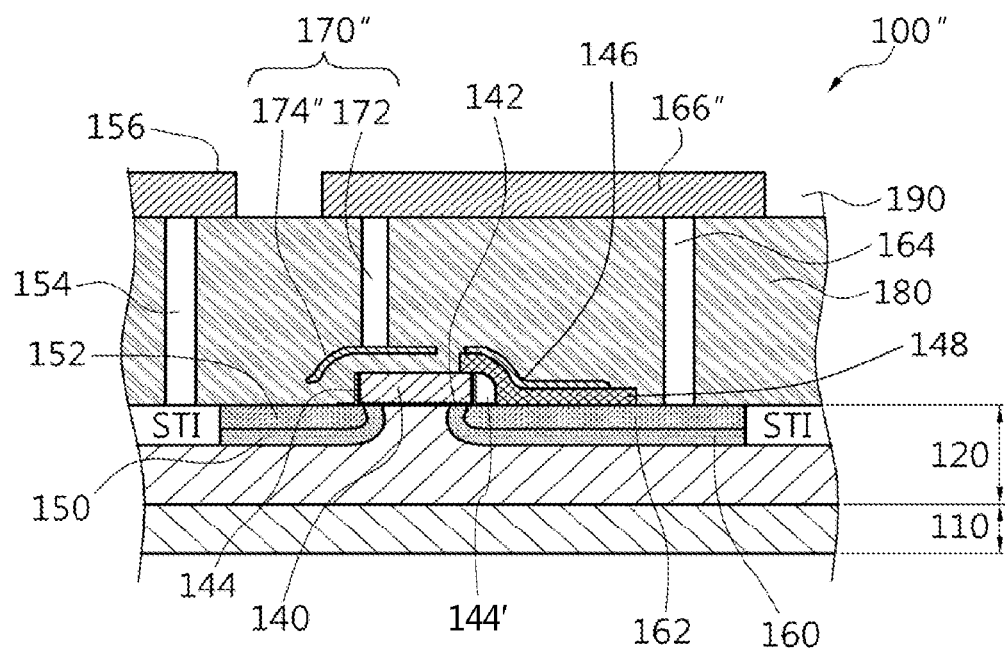
FIG. 5 is a cross-sectional view of an ESD protection device according to one or more further exemplary embodiments of the present disclosure.

FIG. 3 is a cross-sectional view of the ESD protection device according to one or more embodiments of the present disclosure, FIG. 4 is a cross-sectional view of an ESD protection device according to one or more other exemplary embodiments of the present disclosure, and FIG. 5 is a cross-sectional view of an ESD protection device according to one or more further exemplary embodiments of the present disclosure.

Hereinafter, the ESD protection device according to exemplary embodiments of the present disclosure will be described in detail with reference to the accompanying drawings.

Referring to FIG. 3, exemplary embodiments of the present disclosure relate to an ESD protection device 100 and, more particularly, to a device configured so that an upper or uppermost surface of a gate electrode 140 and a capacitor electrode 170 electrically connected to a drain region 162 are spaced apart from each other by a preset distance, and partially or entirely overlap each other, thereby increasing a capacitance Cgd between the gate electrode and the drain region. Accordingly, it is possible to increase the gate-drain capacitance Cgd by including a capacitor in the same area occupied by the MOS transistor, without introducing an external or stand-alone capacitor, so the overall area of the ESD protection device is reduced and the degree of integration of the ESD protection device is increased.

First, the device 100 includes a substrate 110. For example, the substrate 110 may be a P-type doped substrate, a P-type diffusion region in a single-crystal silicon substrate, or a P-type epitaxial layer grown epitaxially on a crystalline silicon substrate, and there is no separate limitation thereto.

A semiconductor layer 120 is formed on the substrate 110, and a device isolation film or structure STI may be in the semiconductor layer 120 to define an active region of the MOS transistor of the ESD protection device. Although it is not shown in FIG. 3, a buried oxide (BOX) layer may be formed as an insulating layer between the substrate 110 and the semiconductor layer 120, as needed or desired. In addition, the device isolation film or structure STI may be formed by, for example, a shallow trench isolation (STI) process. A lower insulating layer 180 and an upper insulating layer 190 are on the semiconductor layer 120, in sequence.

In addition, a gate electrode 140 may be on or over the semiconductor layer 120, and a source region 152 and a drain region 162 may be in the semiconductor layer 120. In detail, a gate insulating film 142 is formed on the uppermost surface of the semiconductor layer 120, and the gate electrode 140 is formed on the uppermost surface of the gate insulating film 142. In addition, a first end or side of the gate electrode 140 may partially overlap the uppermost surface of the source region 152, and a second end or side of the gate electrode 140 may partially overlap the uppermost surface of the drain region 162, but the scope of the present disclosure is not limited thereto.

The gate electrode 140 may comprise any one of conductive polysilicon, a metal, a conductive metal nitride, or a combination thereof, and may be formed through any process, variously known as chemical vapor deposition (CVD), physical vapor deposition (PVD; e.g., sputtering or evaporation), atomic layer deposition (ALD), metal-organic atomic layer deposition (MOALD), or metal-organic chemical vapor deposition (MOCVD) processes, and there is no separate limitation thereto.

In addition, a gate spacer 144, which may comprise one or more of an oxide film (e.g., silicon dioxide), a nitride film (e.g., silicon nitride), or a combination thereof, may be formed on outer surfaces of the gate electrode 140 and the gate insulating film 142. The gate spacer 144 may be formed on less than all side surfaces of both the gate electrode 140 and the gate insulating film 142. For example, the gate spacer 144 may be one side surface, two opposed side surfaces (e.g., as shown in FIG. 3), or all side surfaces of the gate electrode 140 and the gate insulating film 142. There is no separate limitation thereto.

In addition, a body region 150 is formed in the semiconductor layer 120. For example, the source region 152 having a second conductivity type is in the body region 150 (which may have a first conductivity type). In addition, a first metal contact 154 passing through the lower insulating layer 180 contacts the source region 152. The uppermost end or surface of the first metal contact 154 substantially matches the lowermost surface of the upper insulating layer 190. In addition, a metal interconnect 156 (e.g., carrying a signal to the source region 152) may be on or in contact with the first metal contact 154, so that the first metal contact 154 and the metal interconnect 156 may be electrically connected to each other.

In addition, a drift region 160 having a second conductivity type is formed in the semiconductor layer 120 on the opposite side of the gate electrode 140. The drift region 160 is generally spaced apart from the body region 150 by a preset distance related to the length or line width of the gate electrode 140. When the doping concentration of the drift region 160 is less than or equal to a preset level, the on-resistance Rsp characteristics of the MOS transistor may deteriorate, whereas when the doping concentration is above the preset level, the on-resistance Rsp characteristics are improved, but the breakdown voltage characteristics of the MOS transistor may be relatively poor, so it is desirable to form an impurity region having an appropriate doping concentration for the drift region 160 to balance the corresponding characteristics of the MOS transistor.

In addition, the drain region 162 is formed in the drift region 160, spaced apart from the gate electrode 140 by a preset distance (e.g., related to the width of the gate spacer 144). In addition, a second metal contact 164 passing through the lower insulating layer 180 contacts the drain region 162. A metal interconnect 166 (e.g., carrying a signal to the drain region 162) is in contact with the second metal contact 164, so that the second metal contact 164 and the metal interconnect 166 are electrically connected to each other. The second metal contact 164 may be spaced apart from the first metal contact 154 by a preset distance in the horizontal direction. In addition, like the first metal contact 154, the uppermost end or surface of the second metal contact 164 preferably substantially matches a lowermost surface of the upper insulating layer 190, but there is no separate limitation thereto. The metal interconnect 156 and the metal interconnect 166 may comprise, for example, a metal such as aluminum (Al). In addition, the first metal contact 154 and the second metal contact 164 may comprise, for example, a metal such as copper, aluminum, or tungsten, but there is no separate limitation thereto.

The ESD protection device 100 according to exemplary embodiments of the present disclosure is characterized in that a capacitor electrode 170 is provided therein. In detail, the ESD protection device 100 may include: a capacitor contact 172 connected to a metal interconnect 166 (which may be, in turn, electrically connected to the drain region 162); and a capacitive plate or layer 174 connected to the capacitor contact 172 and extending across the gate electrode 140. For example, as shown, the capacitor contact 172 extends from the lowermost surface of the metal interconnect 166, and the capacitive plate or layer 174 may extend from the lowermost surface of the capacitor contact 172 across the gate electrode 140, so as to partially or entirely overlap the upper or uppermost surface of the gate electrode 140.

In this case, it is preferable that the capacitive plate or layer 174 overlaps the gate electrode 140 at a position spaced apart from the gate electrode 140 by a preset distance in the vertical (e.g., height) direction. Since the capacitance between the gate 140 and the capacitive plate or layer 174 is proportional to the opposing areas (A) of and the separation distance (d) between the gate 140 and the capacitive plate or layer 174, it is preferable to maximize the opposing areas by the capacitive plate or layer 174 overlapping the entire length or line width of the gate electrode 140, but there is no separate limitation thereto. In addition, the capacitor electrode 170 (or, more specifically, the capacitive plate or layer 174) may comprise, for example, polysilicon.

By utilizing the capacitor electrode 170 having such a structure, the gate-drain capacitance Cgd value for lowering the triggering voltage Vt1 may be increased, not by an external or stand-alone capacitor, but by the internal or integrated capacitor electrode 170, whereby the Cgd increase characteristic is provided, but the device area is not increased as a result of including the capacitor. That is, the magnitude of the triggering voltage Vt1 may be reduced by increasing the value of the ESD protection device's RC time constant without increasing the area of the ESD protection device by the area of the capacitor. Accordingly, it is possible to start the parasitic bipolar transistor operation and/or function more easily. In addition, the capacitive plate or layer 174 may comprise polysilicon, or may include various conductive materials that are metals or combinations of metals, and is not limited to a specific material.

Referring to FIG. 4, in other exemplary embodiments, the capacitor contact 172 may be located a preset distance from the metal interconnect 156, and extend from a position where the metal interconnect 166' overlaps the gate electrode 140 to the capacitive plate or layer 174', which may extend laterally from a lowermost part of the capacitor contact 172 and partly or entirely overlap the upper or uppermost surface of the gate electrode 140. In other words, the capacitive plate or layer 174' may be configured so that it does not capacitively overlap with the drain region 162, thereby preventing an increase in the drain operating voltage (e.g., relative to the MOS transistor without the capacitor electrode 170').

Referring to FIG. 5, in yet further exemplary embodiments, the ESD protection device according to the present disclosure may have a structure similar to that of a laterally-diffused metal oxide semiconductor (LDMOS) device (e.g., transistor). For convenience of description, in the case of the LDMOS device, known general configurations will be described as briefly as possible. A field plate 146 is formed near (e.g., partially overlapping, but spaced apart from) the gate electrode 140. The field plate 146 partially overlaps the gate electrode 140 on an upper or uppermost surface of the gate electrode 140, and is electrically separated from the gate electrode 140 by an insulating part or layer 148 deposited on the drain region 162, the gate electrode 140, and a gate sidewall spacer 144'. The field plate 146 improves the distribution of electric fields and the MOS device characteristics of on-resistance and current. The insulating part or layer 148 and the gate sidewall spacer 144' may independently comprise silicon oxide (e.g., doped or undoped silicon dioxide), silicon nitride, or the like, and the scope of the present disclosure is not limited by a specific example, although the insulating part or layer 148 and the gate sidewall spacer 144' do not typically include the same materials or have the same structure.

First, the insulating part or layer 148 extends from the uppermost surface of the semiconductor layer 120 (e.g., on the drain region 162), on the gate sidewall spacer 144', and onto the upper or uppermost surface of the gate electrode 140. Thus, the insulating part or layer 148 has a stepped structure. In addition, the field plate 146 on the upper or uppermost surface of the insulating part or layer 148 has a step shape substantially complementary to the insulating part or layer 148.

In such a structure, the capacitive plate or layer 174" may be located a preset distance from the side surface of the metal interconnect 166 opposite from the adjacent metal interconnect 156. Alternatively or additionally, the metal interconnect 166 at least partially overlaps the gate electrode 140 (e.g., the uppermost side or surface of the gate electrode 140), or crosses the gate electrode 140, and the capacitor contact 172 extends from the lowermost surface of the metal interconnect 166 to the uppermost surface of the capacitive plate or layer 174" in a location over or overlapping the gate electrode 140. In addition, the capacitive plate or layer 174" extends laterally from the lowermost part or surface of the capacitor contact 172 and partially overlaps the upper or uppermost surface of the gate electrode 140, but it is desirable for the capacitive plate or layer 174" to be spaced apart by a preset distance from the field plate 146, so as not to contact or connect to the field plate 146. In more detail, the capacitive plate or layer 174" extends from a location above the sidewall of the gate electrode 140 adjacent to the source region 152, toward the drain region 162 and partially overlapping the gate electrode 140, but is spaced laterally apart from the field plate 146 by the preset distance.

In the above exemplary embodiments, the upper or uppermost surface of the gate electrode 140 and the opposite (i.e., facing) surface of the capacitive plate or layer 174, 174' and 174" are spaced apart from each other in the vertical (height) direction. A desired or predetermined separation distance between the gate electrode 140 and the capacitive plate or layer 174, 174' and 174" may be derived with the equation BV=Ec*Tox, where Ec is an electric field strength at a time when the MOS device of the ESD protection device instantaneously breaks down (the critical electric field), BV is a breakdown voltage (e.g., of the insulating layer in the lower insulating layer 180 between the gate electrode 140 and the capacitive plate or layer 174, 174' or 174" when said insulating layer is a silicon dioxide film; i.e., "the effective oxide film"), and Tox is the thickness of the effective oxide film. Accordingly, it is preferable that the thickness Tox of the effective oxide film has a value smaller than the fraction BV/Ec. Here, the critical electric field Ec preferably has a value greater than or equal to 5 MV/cm, and has a value less than or equal to 10 MV/cm, and more preferably has a value of 6 MV/cm, but the invention is not limited to such values.

Figure 6:
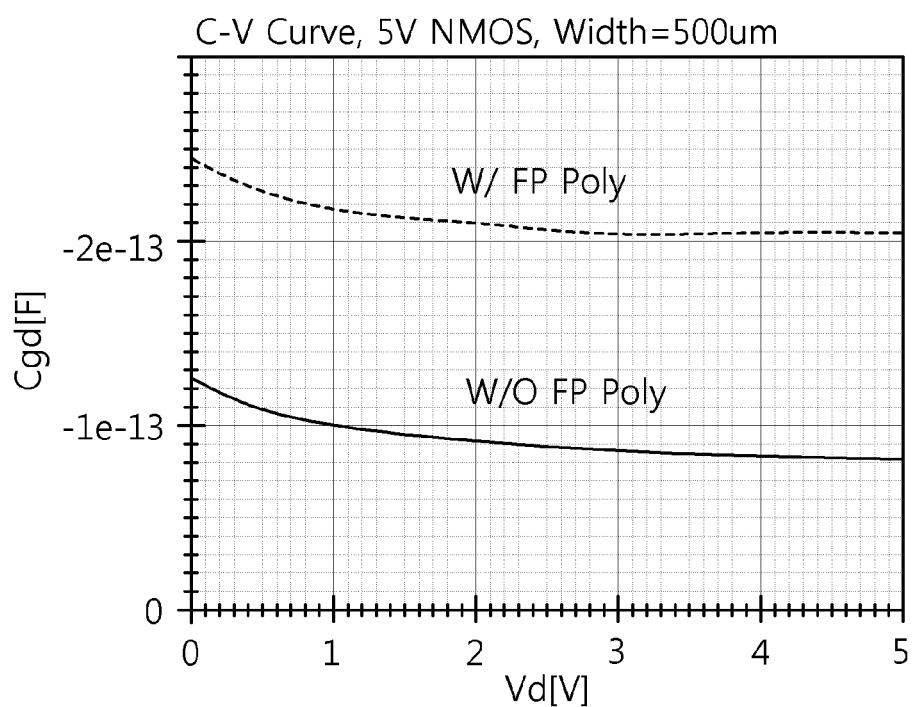
FIG. 6 is a graph showing a comparison result of a gate-drain capacitance between the ESD protection device and/or circuit having an integrated capacitor plate or layer and a general 5-V NMOS device (e.g., transistor) according to exemplary embodiments of the present disclosure.
Figure 7:
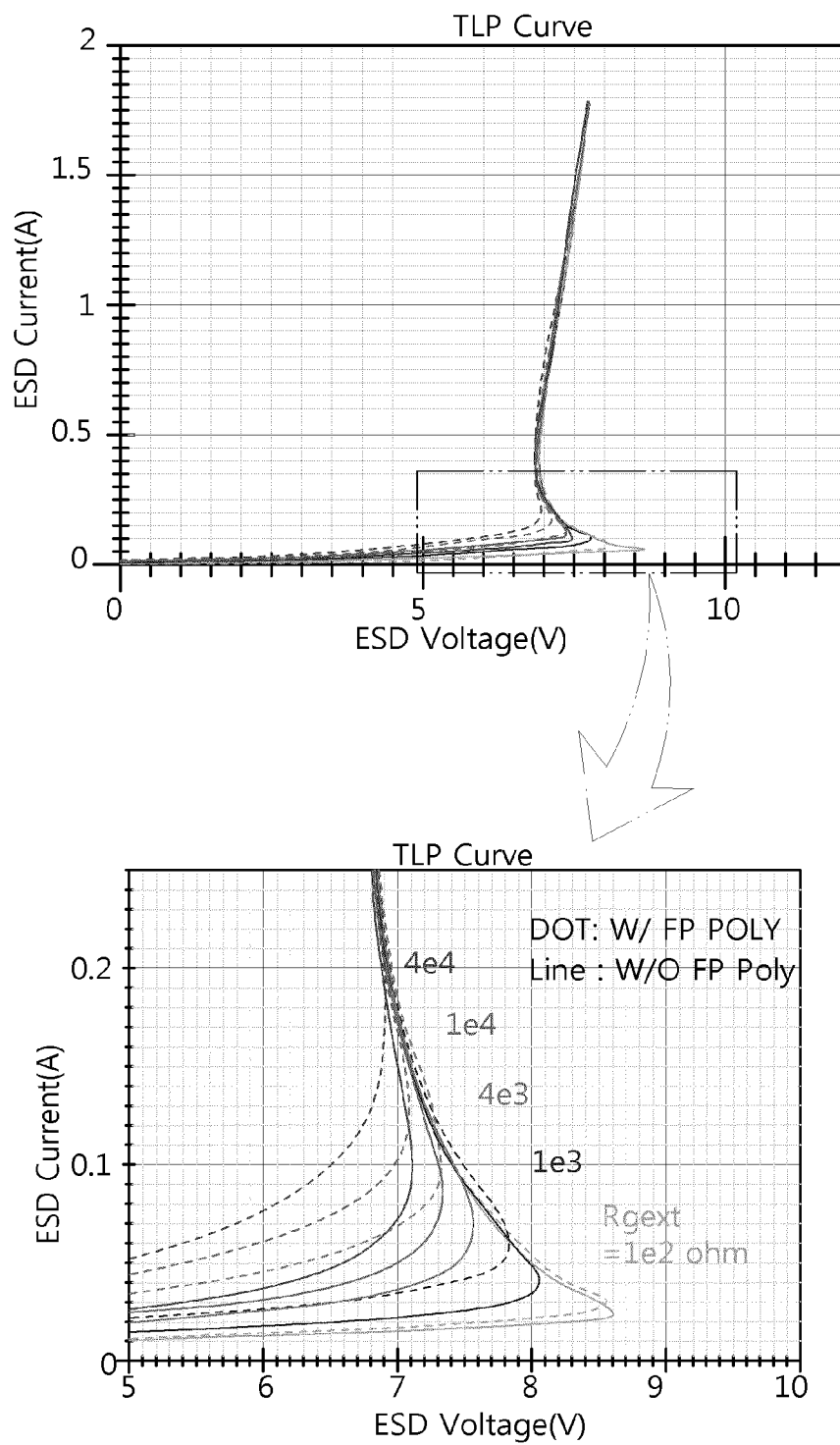
FIG. 7 is a graph showing current and voltage characteristics of the ESD protection device and/or circuit according to exemplary embodiments of the present disclosure.

FIG. 6 is a graph showing a comparison of the gate-drain capacitances of ESD protection devices having an internal capacitor electrode in accordance with the present disclosure ("W/FP Poly") and an otherwise identical general 5-V NMOS device ("W/O FP Poly"), and FIG. 7 is a graph showing ESD current as a function of voltage for ESD protection devices according to exemplary embodiments of the present disclosure.

As described above, the ESD protection devices 100, 100' and 100" according to exemplary embodiments of the present disclosure include the capacitor electrode 170, 170' or 170". Due to the capacitor electrode, referring to FIGS. 2 and 7, when values of the external resistance Rgext between the gate and the source (e.g., of the MOS device) are the same (e.g., 100 Ohms, 1000 Ohms, 4000 Ohms, 10,000 Ohms, or 40,000 Ohms), the triggering voltage is significantly decreased in the ESD protection devices 100, 100' and 100" according to exemplary embodiments of the present disclosure (dashed lines), compared to the current and voltage characteristics of the otherwise identical ESD protection circuit without the internal capacitor electrode (solid lines). Accordingly, the snapback operation may be performed more evenly in the MOS device according to exemplary embodiments of the present disclosure.

In addition, referring to FIG. 6, in the ESD protection circuit including the capacitor electrode 170 (i.e., "W/ FP Poly"), the capacitance between the gate and the drain is approximately doubled, as compared to the ESD protection circuit without the internal capacitor electrode 170 (i.e., "W/O FP Poly"). Therefore, without including an external capacitor, the ESD protection device according to the present disclosure greatly increase the gate-drain capacitance, whereby the time constant RC value increases, and ultimately the triggering voltage may decrease.

FIGS. 8 to 11 are cross-sectional views of a manufacturing method of an ESD protection device according to at least one exemplary embodiment of the present disclosure.

Hereinafter, the manufacturing method of the ESD protection device according to exemplary embodiment(s) of the present disclosure will be described in detail with reference to the accompanying views.

Figure 8:
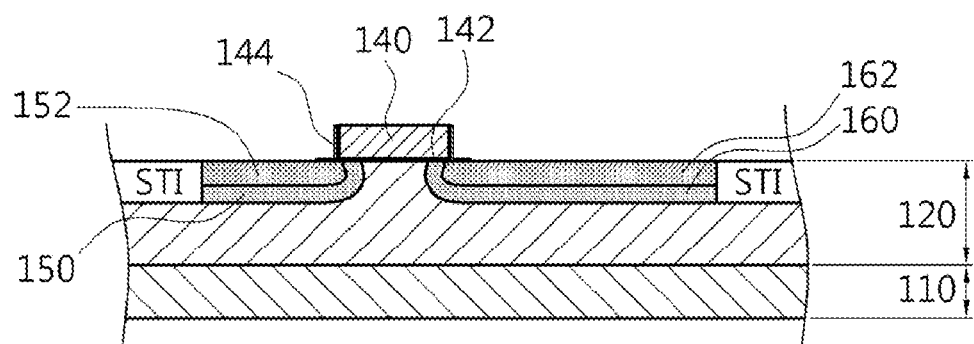
FIGS. 8 to 12 are cross-sectional views regarding a method of manufacturing an ESD protection device according to exemplary embodiment(s) of the present disclosure.

First, referring to FIG. 8, a photoresist pattern (not shown) is formed on the surface of a substrate 110 to define a well region, and the well region is formed by an ion implantation process using the photoresist pattern as an ion implantation mask. Thereafter, a heat treatment process for activating the dopant implanted into the well region may follow.

After that, the photoresist pattern is removed by, for example, an ashing/strip process, and a device isolation film STI is formed to define an active region (e.g., for the ESD protection device). The device isolation film STI may be formed by, for example, a shallow trench isolation process.

A gate insulating film 142 is deposited or formed (e.g., by thermal oxidation of silicon) on the substrate 110, a polysilicon film is deposited on the gate insulating film 142, and then a gate electrode 140 is formed by patterning and etching the polysilicon film and the gate insulating film 142. In addition, gate spacers 144 are conventionally formed on one or more sidewalls of the gate electrode 140. In addition, using the gate electrode 140 as an ion implantation mask, a source region 152 and a drain region 162 are formed (e.g., simultaneously) by ion implantation.

Figure 9:
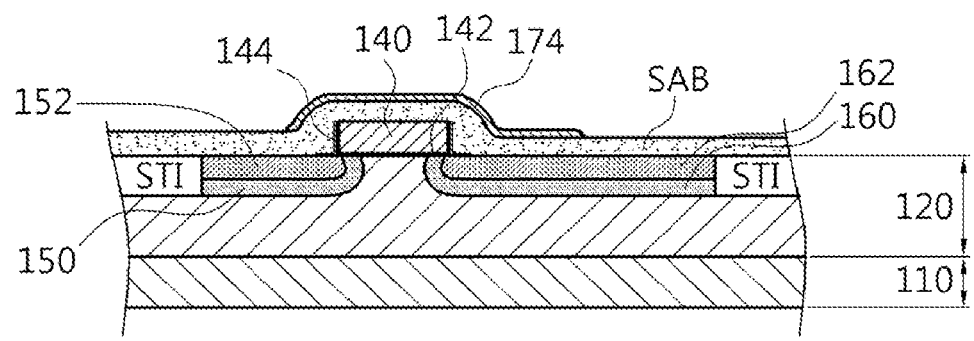

Referring to FIG. 9, thereafter, a salicide block layer (SAB) is formed on the gate electrode 140 and the gate insulating film 142 by sequentially depositing, for example, an oxide film (e.g., silicon dioxide) and a nitride film (e.g., silicon nitride). In addition, a polysilicon film for forming the capacitive plate or layer 174, which is a component of the capacitor electrode 170, is deposited on the salicide block layer and then patterned and etched. In this case, as described above for the device 100 of FIG. 3, the capacitive plate or layer 174 is patterned to completely overlap the upper or uppermost surface of the gate electrode 140. Furthermore, the capacitive plate or layer 174 is spaced apart from the gate electrode 140 by a preset distance (e.g., the thickness of the salicide block layer SAB). In addition, it is preferable that the capacitive plate or layer 174 is substantially parallel to the gate electrode 140 in the area where the capacitive plate or layer 174 and the gate electrode 140 overlap.

In other exemplary embodiments, a capacitive plate or layer 174' or 174" may be patterned on the upper or uppermost surface of the gate electrode 140 to partially or substantially completely overlap the gate electrode 140, but completely or substantially completely not overlap the drain region 162 (refer to FIG. 4 or FIG. 5). Yet further exemplary embodiments further comprise forming a gate sidewall spacer 144' by conventional blanket deposition and subsequent blanket etchback of one or more insulating layers (as described herein) in a combined thickness of less than the height of the gate electrode 140, and forming a field plate 146 (FIG. 5) by patterning and etching the polysilicon film on the salicide block layer SAB so that the capacitive plate or layer 174 completely overlaps one sidewall of the gate electrode 140 adjacent to the source region 152, but does not to extend to the sidewall on the opposite side of the gate electrode 140 adjacent to the drain region 162, and the field plate 146 partially overlaps the upper or uppermost surface of the gate electrode 140, completely overlaps gate sidewall spacer 144', and partially overlaps the drain region 162, thereby being spaced apart from the field plate 146 by a preset distance. In each of the disclosed embodiments, the salicide block layer SAB may be etched at this time in the method, using the same photoresist pattern used to etch the capacitive plate or layer 174, 174' or 174" and, when present, the field plate 146.

Figure 10:
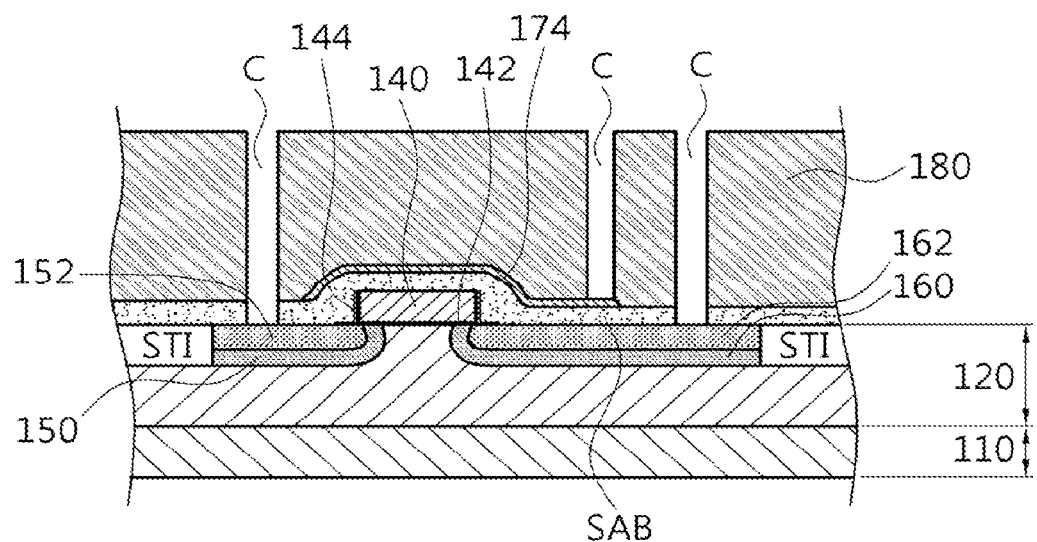

Referring to FIG. 10, after the capacitive plate or layer 174 is formed, a lower insulating layer 180 is formed on the capacitive plate or layer 174 and the salicide block layer SAB. The lower insulating layer 180 may comprise a conventional pre-metal dielectric (PMD) film, which may be considered an interlayer insulating film for electrically insulating the transistors from overlying wiring (which is formed later). For example, the lower insulating layer 180 may be a single layer or a multilayer structure comprising phosphosilicate glass (PSG), borophosphosilicate glass (BPSG), and/or a plasma-enhanced tetraethyl orthosilicate (PE-TEOS)-based silicon dioxide. Then, patterning and etching the lower insulating layer 180 in the positions corresponding to the first metal contact 154, the second metal contact 164, and the capacitor contact 172 forms contact holes C.

Figure 11:
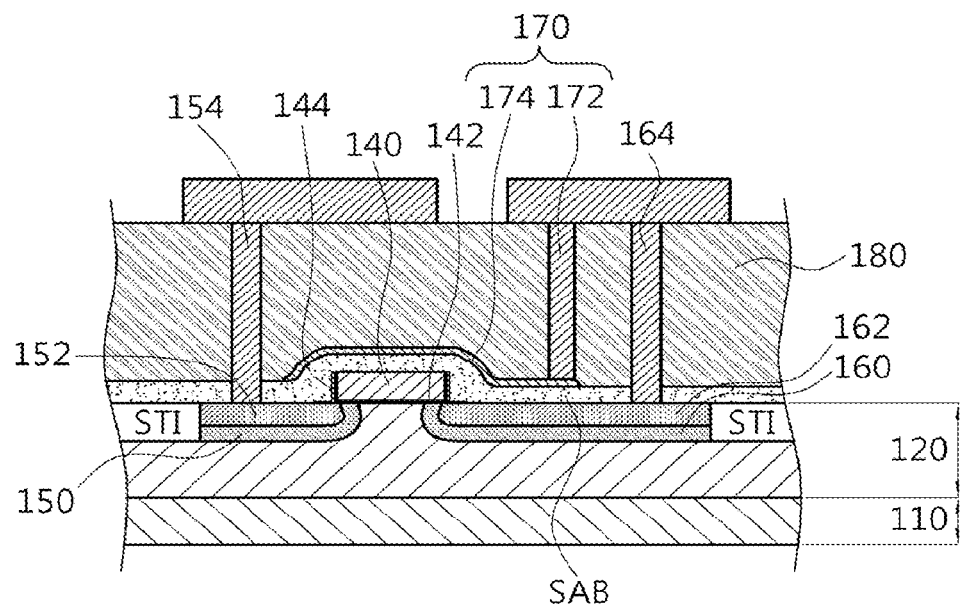

Referring to FIG. 11, the contact holes C are filled with a metal such as copper, aluminum, or tungsten, and a planarization process is performed until the lower insulating layer 180 is exposed, to form the first metal contact 154, the second metal contact 164, and the capacitor contact 172.

In this case, according to exemplary embodiments, the capacitor contact 172 extends to the capacitive plate or layer 174 overlapping the drain region 162. According to other exemplary embodiments, the capacitor contact 172 extends to the capacitive plate or layer 174 overlapping the gate electrode 140.

Thereafter, a metal interconnect 156 and a metal interconnect 166 are formed on the lower insulating layer 180. The metal interconnect 156 is connected to the first metal contact 154, and the metal interconnect 166 is connected to each of the second metal contact 164 and the capacitor contact 172. In detail, for example, after depositing a sacrificial layer (not shown) on the lower insulating layer 180, the sacrificial layer is patterned and etched to form trenches where the metal interconnect 156 and the metal interconnect 166 are to be formed. In this case, the sacrificial layer may comprise, for example, a dielectric material having a low dielectric constant, such as a carbon-containing silicon oxide (e.g., silicon oxycarbide, or SiOC) or an SiOC further incorporating hydrogen (e.g., in the form of —CH$_3$ groups).

Thereafter, the trenches are filled with a metal, and the metal is planarized to form the metal interconnect 156 and the metal interconnect 166.

Figure 12:
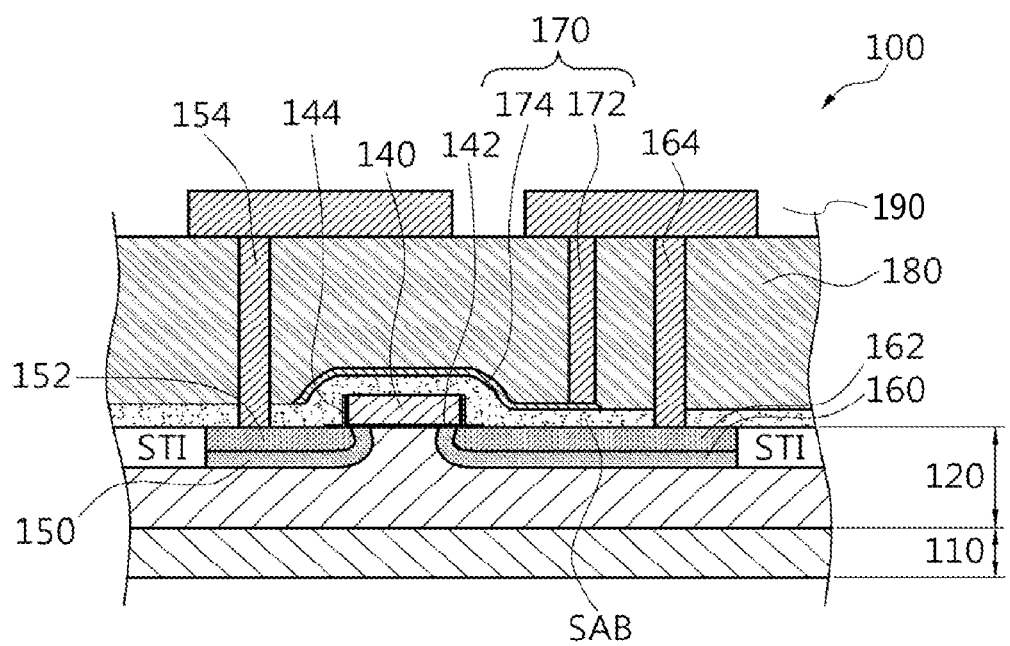

Referring to FIG. 12, after that, the sacrificial layer is removed, and the upper insulating layer 190 is formed on the lower insulating layer 180. The upper insulating layer 190 may comprise, for example, a laminated oxide-nitride film (e.g., a layer of silicon dioxide with a layer of silicon nitride thereon), a laminated oxide-silicon oxycarbide film, and the like.

The detailed description above is illustrative of the present disclosure. In addition, the above description shows and describes preferred embodiments of the present disclosure, and the embodiments of the present disclosure may be used in various other combinations, modifications, and environments. That is, changes or modifications may be made within the scope of the disclosure in the present specification, the scope equivalent to the disclosed contents described previously, and/or the scope of the skill or knowledge in the art. The above-described exemplary embodiments are to describe the best state for implementing the technical idea of the present disclosure, and various modifications for specific applications and uses of the present disclosure are possible. Therefore, the detailed description of the disclosure is not intended to limit the present disclosure to the disclosed embodiments.

What is claimed is:

1. An ESD protection device comprising:
   a substrate;
   a semiconductor layer on the substrate;
   a gate insulating film on the semiconductor layer;
   a gate electrode on the gate insulating film;
   a source region in the semiconductor layer, adjacent to or partially overlapping a first side of the gate electrode;
   a drain region in the semiconductor layer, adjacent to or partially overlapping a second side of the gate electrode;
   a lower insulating layer and an upper insulating layer on or over the semiconductor layer;
   a first metal contact extending through the lower insulating layer to the source region;
   a second metal contact extending through the lower insulating layer to the drain region;
   a metal interconnect on the lower insulating layer, electrically connected to the second metal contact; and
   a capacitor electrode electrically connected to the metal interconnect and overlapping the gate electrode, wherein the capacitor electrode comprises:
      a capacitor contact connected to the metal interconnect and extending through the lower insulating layer, and
      a capacitive plate or layer connected to the capacitor contact, extending from over the first side of the gate electrode and across the gate electrode, partially or entirely overlapping an upper or uppermost surface of the gate electrode.

2. The ESD protection device of claim 1, wherein the capacitive plate or layer is spaced apart from the upper or uppermost surface of the gate electrode by a preset distance.

3. The ESD protection device of claim 2, wherein the capacitive plate or layer has one or more regions overlapping the gate electrode that are substantially parallel to the upper or uppermost surface of the gate electrode.

4. The ESD protection device of claim 1, wherein the metal interconnect has an end that overlaps the gate electrode.

5. An ESD protection device comprising:
   a substrate;
   a semiconductor layer on the substrate;
   a gate insulating film on the semiconductor layer;
   a gate electrode on the gate insulating film;
   a source region in the semiconductor layer, adjacent to or partially overlapping a first side of the gate electrode;
   a drain region in the semiconductor layer, adjacent to or partially overlapping a second side of the gate electrode;
   a lower insulating layer on the semiconductor layer;
   a metal contact extending through the lower insulating layer to the drain region;
   a metal interconnect on the lower insulating layer, connected to the metal contact and having an end that overlaps the gate electrode; and
   a capacitor electrode electrically connected to one side of the metal interconnect and overlapping the gate electrode,
   wherein the capacitor electrode comprises:
      a capacitor contact connected to a lowermost part of the end of the metal interconnect; and
      a capacitive plate or layer connected to a lowermost surface of the capacitor contact, extending substantially parallel to an upper or uppermost surface of the gate electrode and overlapping the upper or uppermost surface of the gate electrode, spaced apart from the upper or uppermost surface of the gate electrode.

6. The ESD protection device of claim 5, wherein the capacitor contact overlaps the drain region, and
   the capacitive plate or layer extends from the drain region toward the source region and overlaps the upper or uppermost surface of the gate electrode.

7. The ESD protection device of claim 5, wherein a separation distance between the gate electrode and the capacitive plate or layer is less than a breakdown voltage divided by a threshold field.

8. An ESD protection device comprising:
   a substrate;
   a semiconductor layer on the substrate;
   a gate insulating film on the semiconductor layer;
   a gate electrode on the gate insulating film;
   a source region in the semiconductor layer;
   a drain region in the semiconductor layer and spaced apart from the source region;
   a lower insulating layer on the semiconductor layer;
   a metal contact passing through the lower insulating layer and extending to the drain region;
   a metal interconnect on the lower insulating layer, connected to the metal contact;
   a field plate partially overlapping the gate electrode on one side adjacent to the drain region;
   an insulating part or layer electrically separating the gate electrode from the field plate; and
   a capacitor electrode electrically connected to the metal interconnect, partially overlapping the gate electrode, and spaced apart from the field plate.

9. The ESD protection device of claim 8, wherein the insulating part or layer has a stepped structure, from a surface of the drain region, on a side surface of the gate electrode, and on an upper or uppermost surface of the gate electrode, and the field plate is on an upper or uppermost surface of the insulating part or layer and has a shape substantially complementary or conforming to the insulating part or layer.

10. The ESD protection device of claim 9, wherein the capacitor electrode comprises:

a capacitor contact extending from the metal interconnect; and a capacitive plate or layer connected to the capacitor contact and over an edge or sidewall of the gate electrode adjacent to the source region.

11. The ESD protection device of claim 10, wherein the capacitive plate or layer comprises a same material as the field plate.

12. The ESD protection device of claim 10, wherein the capacitive plate or layer extends substantially parallel to the gate electrode and is spaced apart from the field plate.

* * * * *